United States Patent
Suzuki et al.

(10) Patent No.: US 9,171,874 B2
(45) Date of Patent: Oct. 27, 2015

(54) SOLID-STATE IMAGING DEVICE INCLUDING AN IMAGING ELEMENT AND A COVER MEMBER HAVING A QUARTZ PLATE

(75) Inventors: Takanori Suzuki, Tokyo (JP); Fujio Ito, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 787 days.

(21) Appl. No.: 13/033,332

(22) Filed: Feb. 23, 2011

(65) Prior Publication Data

US 2011/0205413 A1 Aug. 25, 2011

(30) Foreign Application Priority Data

Feb. 25, 2010 (JP) .................................. 2010-040599

(51) Int. Cl.
*H01L 27/146* (2006.01)
*H04N 5/225* (2006.01)

(52) U.S. Cl.
CPC ........ *H01L 27/14618* (2013.01); *H04N 5/2253* (2013.01); *H01L 2224/48091* (2013.01)

(58) Field of Classification Search
None
See application file for complete search history.

(56) References Cited

U.S. PATENT DOCUMENTS

| | | | | |
|---|---|---|---|---|
| 4,896,217 A | * | 1/1990 | Miyazawa et al. | 348/340 |
| 5,463,496 A | * | 10/1995 | Ise | 359/489.02 |
| 5,471,343 A | * | 11/1995 | Takasugi | 359/489.16 |
| 5,971,546 A | * | 10/1999 | Park | 353/38 |
| 6,980,250 B1 | * | 12/2005 | Kayanuma et al. | 348/342 |
| 7,122,787 B2 | * | 10/2006 | Nishizawa | 250/239 |
| 7,123,412 B2 | * | 10/2006 | Saitoh et al. | 359/489.08 |
| 8,025,950 B2 | * | 9/2011 | Saito | 428/137 |
| 8,033,446 B2 | * | 10/2011 | Wada et al. | 228/180.22 |
| 8,514,316 B2 | * | 8/2013 | Okazaki et al. | 348/340 |
| 2003/0165018 A1 | * | 9/2003 | Mihara | 359/680 |
| 2007/0267661 A1 | * | 11/2007 | Tsukada | 257/232 |
| 2008/0008424 A1 | * | 1/2008 | Shimizu | 385/51 |
| 2009/0096915 A1 | * | 4/2009 | Kelly et al. | 348/360 |
| 2009/0135281 A1 | * | 5/2009 | Oda et al. | 348/273 |
| 2010/0060771 A1 | * | 3/2010 | Shintani | 348/333.01 |
| 2011/0252834 A1 | * | 10/2011 | Ono | 65/111 |

FOREIGN PATENT DOCUMENTS

| | | |
|---|---|---|
| CN | 2457629 Y | 10/2001 |
| CN | 2475013 Y | 1/2002 |
| CN | 101256251 A | 9/2008 |
| CN | 101514490 A | 8/2009 |
| JP | 2000-114502 A | 4/2000 |
| JP | 2002-033636 A | 1/2002 |
| JP | 2002-353352 A | 12/2002 |
| JP | 2003-68908 A | 3/2003 |
| JP | 2003-279852 A | 10/2003 |
| JP | 2007-256590 A | 10/2007 |
| JP | 2008-042797 A | 2/2008 |
| JP | 2008-108808 A | 5/2008 |

\* cited by examiner

*Primary Examiner* — Albert Cutler
(74) *Attorney, Agent, or Firm* — Canon USA, Inc. IP Division (57) ABSTRACT

A solid-state imaging device includes an imaging element having a light receiving surface, and a cover member disposed over and opposite to the light receiving surface of the imaging element with a space therebetween. The cover member has a quartz plate, and the optical axis of the crystal of the quartz plate is parallel to the light receiving surface.

30 Claims, 9 Drawing Sheets

SOLID-STATE IMAGING DEVICE INCLUDING AN IMAGING ELEMENT AND A COVER MEMBER HAVING A QUARTZ PLATE

BACKGROUND OF THE INVENTION

1. Field of the Invention

The present invention relates to a solid-state imaging device using an imaging element, an imaging unit, and an imaging apparatus.

2. Description of the Related Art

Some of known imaging apparatuses have a Z-cut quartz plate formed of a single crystal containing small amounts of impurities such as heavy metals, the Z-cut quartz plate serving as a solid-state imaging element cover that seals the package (see Japanese Patent Laid-Open No. 2008-042797). Z-cut quartz plate is a quartz plate cut so that the normal to the major surfaces of the quartz plate is at a zero degree angle to the Z-axis, the optical axis of the quartz.

In the above-described known imaging apparatuses, at the time of reflow soldering in the mounting process or use of a camera in a high-temperature environment, the cover member glued to the package base deforms significantly, and there is a possibility that the cover member will peel or break. With the increase in deformation of the cover member, the width of separation of a ray of light obliquely incident on the quartz plate from the lens due to the double refraction property of the quartz plate increases. Because Z-cut quartz plate is a quartz plate cut perpendicularly to the Z-axis direction, ray separation occurs in directions corresponding to all of the vibration directions of incident light. As a result, the resolution of shot images decreases.

SUMMARY OF THE INVENTION

In an aspect of the present invention, a solid-state imaging device includes an imaging element having a light receiving surface, and a cover member disposed over and opposite to the light receiving surface of the imaging element with a space therebetween. The cover member has a quartz plate, and an optical axis of a crystal of the quartz plate is parallel to the light receiving surface.

Further features of the present invention will become apparent from the following description of exemplary embodiments with reference to the attached drawings.

DESCRIPTION OF THE EMBODIMENTS

The embodiments of the present invention will now be described with reference to FIGS. 1A to 9.

First Embodiment

An solid-state imaging device of this embodiment has an imaging element having a light receiving surface, and a cover member disposed over and opposite to the light receiving surface with a space therebetween, and is characterized in that the cover member has a quartz plate, and the optical axis of the crystal of the quartz plate is parallel to the light receiving surface. A detailed description will be given with reference to FIGS. 1A and 1B.

Figure 1A:
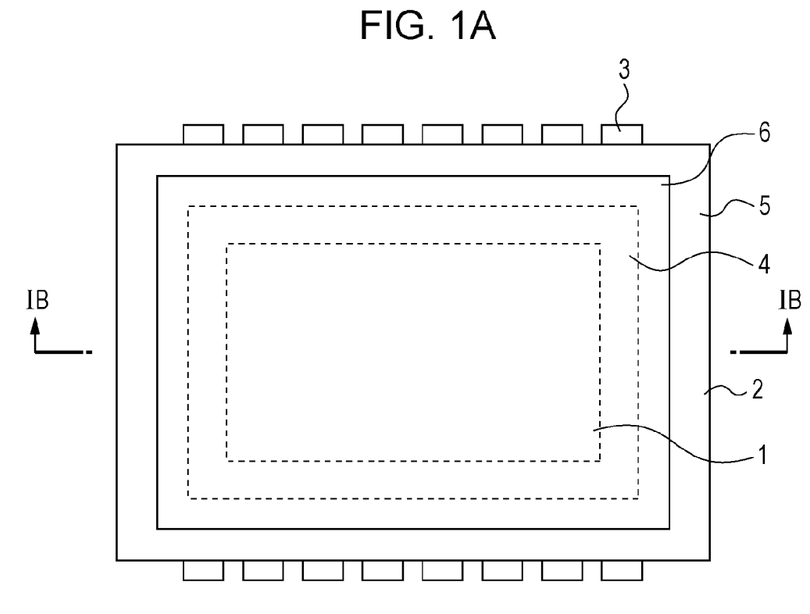
FIGS. 1A and 1B illustrate a solid-state imaging device of a first embodiment.
Figure 1B:
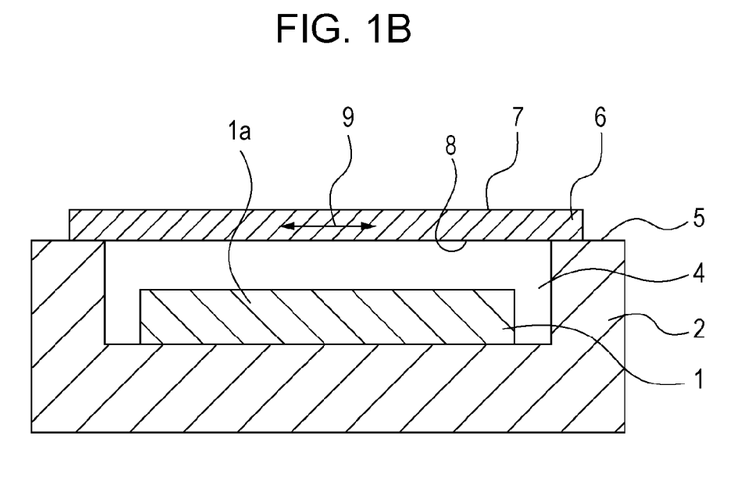

FIG. 1A is a plan view of a solid-state imaging device showing a first embodiment, and FIG. 1B is a sectional view taken along line IB-IB of FIG. 1A.

The solid-state imaging device shown in FIGS. 1A and 1B has a solid-state imaging element 1 having a plurality of light receiving elements, a package base 2 having a recessed portion, a lead frame 3 included in the package base 2, and a quartz plate 6 serving as a cover member. The solid-state imaging element 1 has a light receiving surface 1a on which light is incident. The solid-state imaging element 1 is fixed to the package base 2 with adhesive (not shown). The cover member 6 is fixed with adhesive (not shown) to the upper surface 5 of the frame portion of the package base 2. As a result, the solid-state imaging element 1 has a space 4 surrounded by the package base 2 and the quartz plate 6.

The quartz plate 6 has a first major surface 7 on the light entrance side and a second major surface 8 on the light exit side. Reference numeral 9 denotes the optical axis direction of the quartz plate 6, which is parallel to the first major surface 7 and the second major surface 8 of the quartz plate. The quartz plate 6 may have an AR coating and/or an IR cut coating on the first major surface 7 and/or the second major surface 8. When the quartz plate has various thin film coatings, the surface of a coating for preventing reflection, cutting infrared light, or the like formed on the quartz plate will be defined as a major surface of the quartz plate.

Figure 2A:
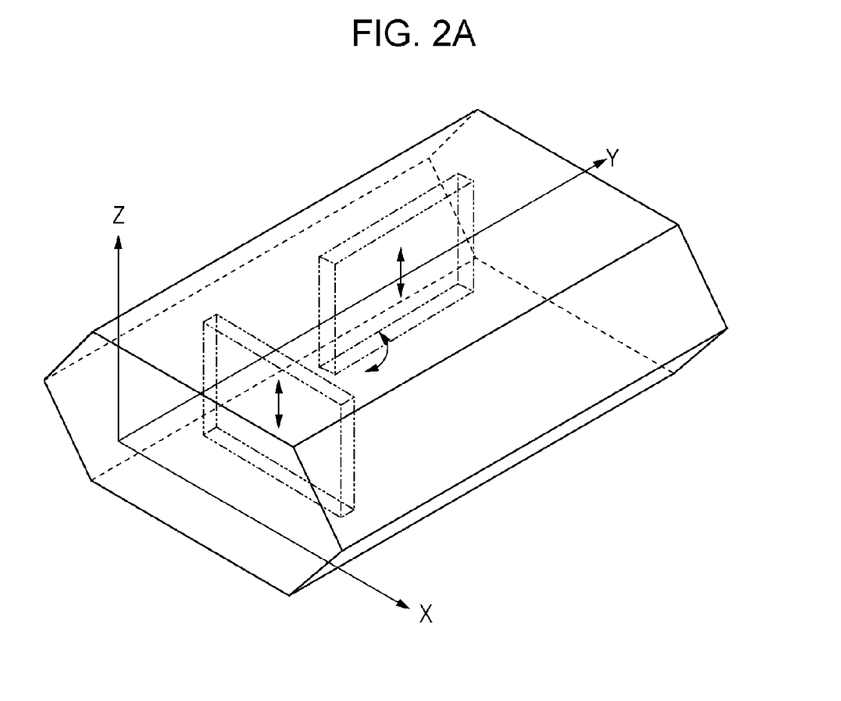
FIGS. 2A and 2B illustrate a quartz ingot showing the crystal axes of quartz plates.
Figure 2B:
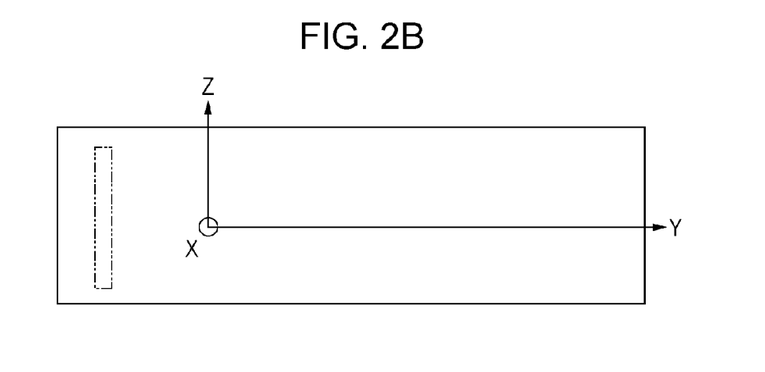

FIGS. 2A and 2B are schematic views of a quartz ingot showing the crystal axes of quartz plates. As shown in FIG. 1B, the optical axis direction of the quartz plate 6 is the Z-axis direction in FIGS. 2A and 2B. In FIGS. 2A and 2B, the Z-axis is the crystal growth direction of the quartz ingot called optical axis. The X-axis perpendicular to the Z-axis is a direction called electrical axis, and the Y-axis perpendicular to the Z-axis is a direction called mechanical axis. The quartz plate according to the present invention can be formed by cutting out in such a direction that the optical axis (Z-axis) is parallel to the major surfaces. FIG. 2A shows examples of quartz plates 6 obtained from a quartz ingot. FIG. 2A shows both the case where a quartz plate 6 is parallel to the Z-axis and X-axis directions and the case where a quartz plate 6 is parallel to the Z-axis and Y-axis directions. A quartz plate 6 can be cut out in any direction as long as the major surfaces are parallel to the Z-axis. FIG. 2B shows the case where a quartz plate 6 is cut out parallel to the Z-axis and Y-axis. Due to the machining error when a quartz plate is cut out from an ingot, a quartz plate inclined to the optical axis may be formed. However, if the inclination to the optical axis is within a range of ±3°, sufficiently high heat resistance can be achieved, and the decrease in image resolution can be sufficiently prevented. Therefore, the wording "the first major surface and the second major surface of the quartz plate are parallel to the optical axis" should be understood as meaning that the inclination to the optical axis is within a range of ±3°.

FIGS. 3A to 3F are plan views and front views showing examples of quartz plates cut out from an ingot, and each shows that the planes that are the first major surface 7 and the second major surface 8 are parallel to the optical axis direction 9. The characteristic of each will be described.

Figure 3A:
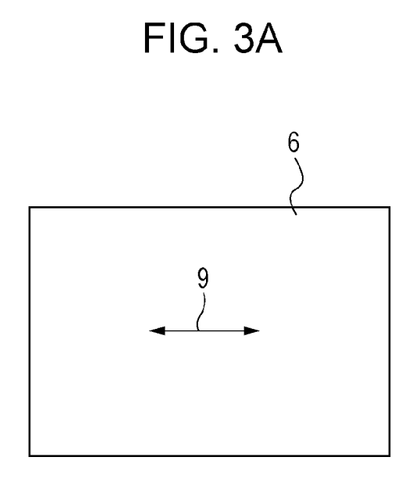
FIGS. 3A to 3F illustrate the crystal axes of quartz plates.
Figure 3B:
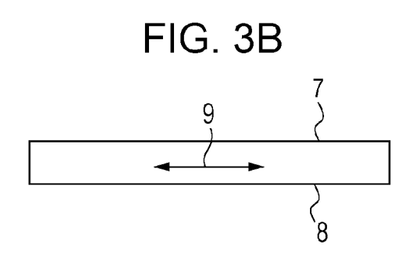

In the quartz plate 6 shown in FIG. 3A (plan view) and FIG. 3B (front view), the long side of the quartz plate 6 is parallel to the optical axis direction 9. In the quartz plate 6 shown in FIG. 3C (plan view) and FIG. 3D (front view), the short side of the quartz plate 6 is parallel to the optical axis direction 9. In the quartz plate 6 shown in FIG. 3E (plan view) and FIG. 3F (front view), neither the long side nor the short side is parallel to the optical axis direction 9.

Due to the anisotropy of quartz, the foregoing quartz plates 6 have higher bending rigidity than quartz plates made by cutting in other directions. The use of any one of the foregoing quartz plates as a cover member of a solid-state imaging device can reduce the deformation of the cover member caused by the increased pressure within the hollow portion under high temperature, and therefore provides at least two benefits.

A first benefit is that the possibility that the cover member will break or peel can be reduced. When a stress exceeds the breaking strength or the adhesive strength of the cover member due to the deformation of the cover member, breakage or peeling may occur. This embodiment can reduce the occurrence of these situations, because the deformation of the cover member is small.

A second benefit is that the possibility of the decrease in resolution can be reduced. Due to the deformation of the cover member, even light perpendicularly incident on the light receiving surface of the solid-state imaging device is obliquely incident on the major surface of the quartz plate, and therefore the resolution decreases due to the double refraction characteristic of quartz. The decrease in resolution can be reduced because the deformation of the cover member is small. In the case of an optical system through lenses of a camera, a video camera, or the like, most light is not perpendicular but oblique to the major surface of the quartz plate. The light separation width of light oblique to the major surface of the quartz plate can be made small compared to quartz plates of other cutting angles. Therefore, the resolution of images obtained by the solid-state imaging device of this embodiment is excellent.

Figure 3C:
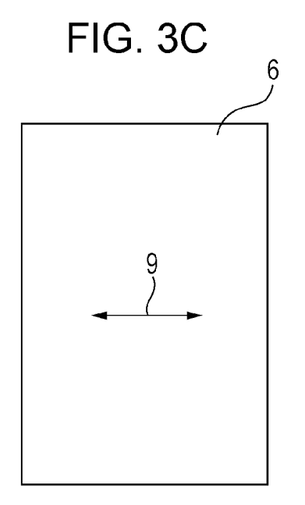
Figure 3D:
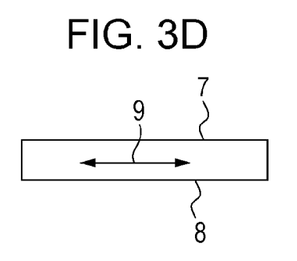
Figure 3E:
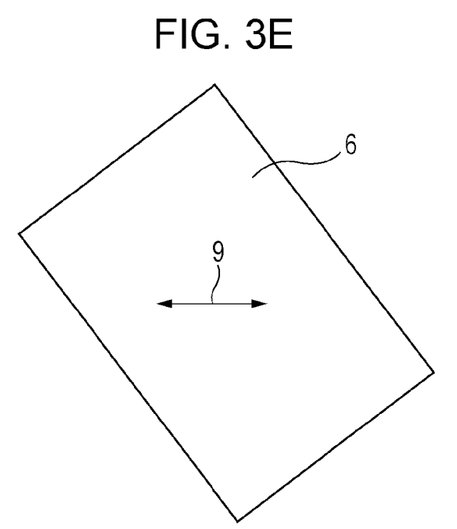
Figure 3F:
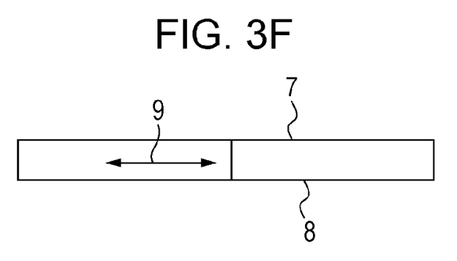

In particular, the quartz plate shown in FIGS. 3C and 3D the short side of which is parallel to the optical axis direction 9 has the highest rigidity, and therefore both the first and second benefits thereof are excellent.

Although the quartz plates 6 shown in FIGS. 3A to 3F are rectangular, they may be square.

Figure 4A:
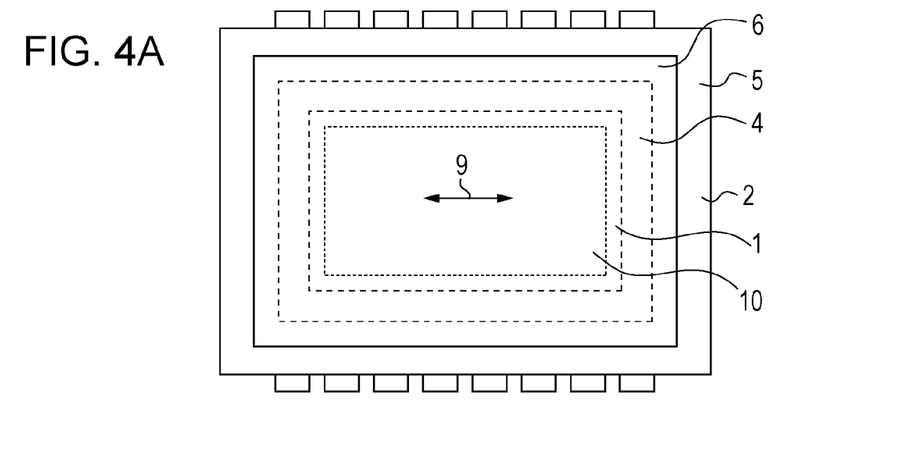
FIGS. 4A to 4C illustrate the solid-state imaging device of the first embodiment.
Figure 4B:
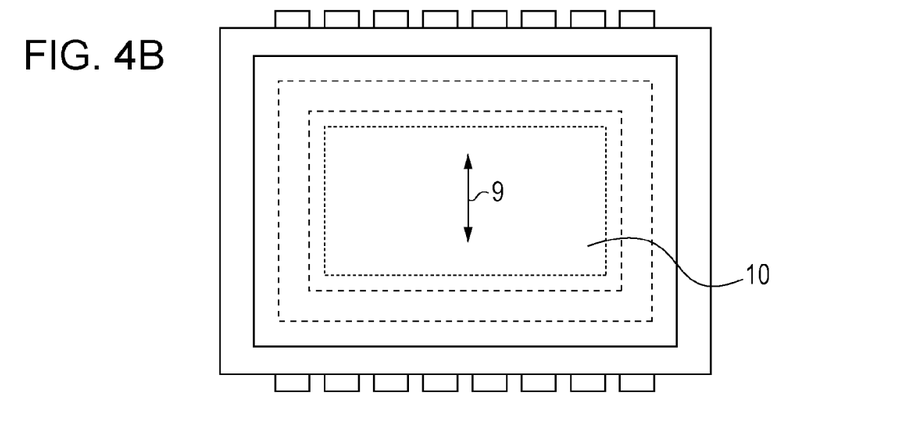
Figure 4C:
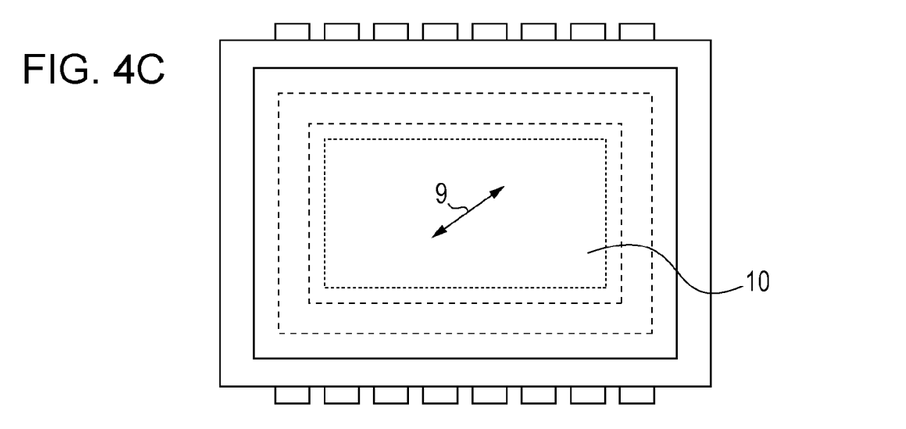

FIGS. 4A to 4C are plan views showing the arrangement of the quartz plate 6 of the solid-state imaging device.

FIGS. 4A, 4B, and 4C each show a solid-state imaging device including: a solid-state imaging element 1 disposed in a package base 2 and having an effective pixel region 10 in which a plurality of light receiving elements are disposed; and a quartz plate 6 disposed on the upper surface of the frame portion. The effective pixel region of the light receiving surface of the solid-state imaging element 1 is rectangular. In each figure, the optical axis direction 9 of the crystal of the quartz plate 6 is parallel to the light receiving surface, and the major surfaces of the quartz plate 6 are parallel to the optical axis direction 9. The following is the difference between FIGS. 4A, 4B, and 4C.

In the solid-state imaging device of FIG. 4A, the optical axis direction 9 of the crystal of the quartz plate 6 is disposed parallel to the long side of the effective pixel region 10 of the solid-state imaging element 1. In the solid-state imaging device of FIG. 4B, the optical axis direction 9 of the crystal of the quartz plate 6 is disposed parallel to the short side of the effective pixel region 10 of the solid-state imaging element 1. In the solid-state imaging device of FIG. 4C, the optical axis direction 9 of the crystal of the quartz plate 6 is disposed parallel to neither the long side nor the short side of the effective pixel region 10 of the solid-state imaging element 1. In each solid-state imaging device, the light receiving surface is parallel to the optical axis direction 9 of the crystal of the quartz plate 6. Therefore, each solid-state imaging device has the above-described first and second benefits. In the solid-state imaging device of FIG. 4B, the optical axis direction 9 is disposed parallel to the short side direction of the effective pixel region 10. Therefore, if separation of incident light occurs, the width of the separation is the smallest, and the possibility of the decrease in resolution can be further reduced.

Although the relationship between the optical axis direction of the quartz plate and the arrangement of the quartz plate as a cover member has been described, in one embodiment the thickness of the quartz plate is at least 0.2 mm but no more than 1.0 mm, or at least 0.3 mm but no more than 0.6 mm. A quartz plate is higher in rigidity than a glass plate. However, when the thickness is less than 0.2 mm, the expansion of the quartz plate due to temperature change, for example, at high temperature and the deformation of the quartz plate due to change of pressure within the space 4 (hollow) are significant. The insufficient rigidity of the quartz plate increases the possibility that the quartz plate will break or peel. The increase in light separation width caused by the increase in the amount of deformation (warpage) of the quartz plate increases the possibility that the resolution will decrease. When the thickness of the quartz plate is larger than 1.0 mm, the light separation width of incident light oblique to the major surface is significant, and therefore the resolution is likely to be low.

As described above, the optical axis direction 9 of the crystal of the quartz plate 6 serving as a cover member of a solid-state imaging device is parallel to the light receiving surface, and the short side of the effective pixel region is parallel to the optical axis direction 9. And the planes that are major surfaces of the quartz plate are parallel to the optical axis direction 9.

As described above, this embodiment provides a solid-state imaging device that has high heat resistance and therefore has high reliability and can obtain high-quality images.

Second Embodiment

Figure 5A:
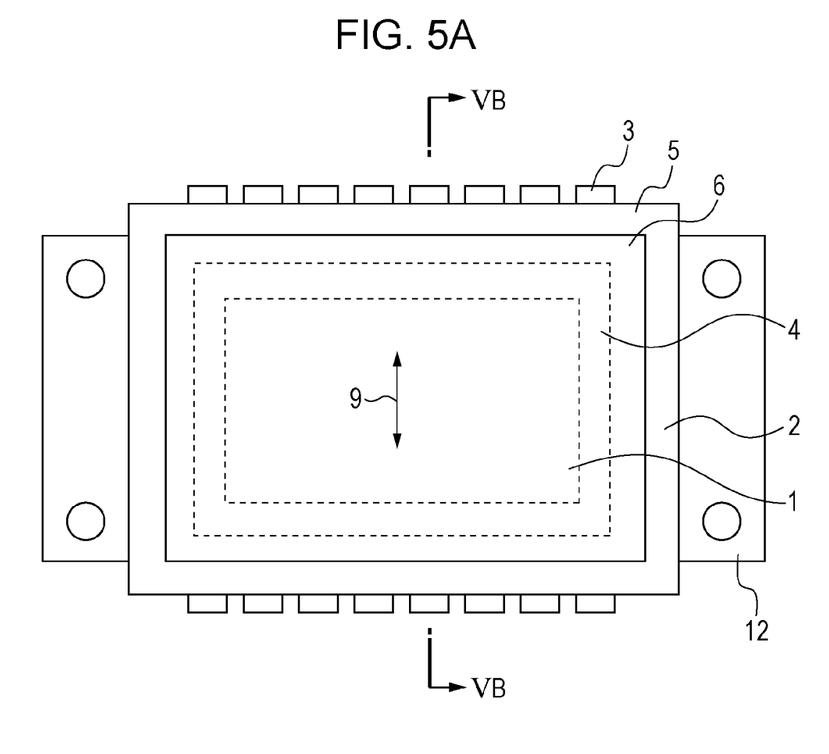
FIGS. 5A and 5B illustrate a solid-state imaging device of a second embodiment.
Figure 5B:
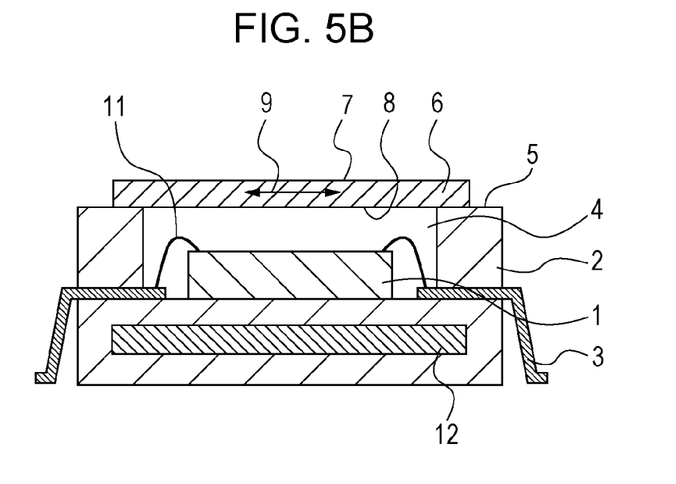

FIGS. 5A and 5B show a second embodiment of the present invention. FIG. 5A is a plan view of a solid-state imaging device, and FIG. 5B is a sectional view taken along line VB-VB of FIG. 5A.

This embodiment differs from the solid-state imaging device of the first embodiment in that a metal plate is integrated in the package base and partly projects from the package base. Such a package base 2 is formed by insert molding of resin and a metal plate 12. The metal plate 12 is made of, for example, stainless steel or aluminum.

As shown in FIGS. 5A and 5B, the metal plate is disposed so as to project from the sides of the package base in the direction perpendicular to the optical axis direction 9 of the quartz plate 6.

Because the package base 2 and the quartz plate 6 differ in coefficient of thermal expansion, the quartz plate 6 may peel from the package base 2 when the temperature change of the surroundings of the solid-state imaging device is significant. The configuration of this embodiment can reduce the amount of deformation of the package base due to temperature change and therefore can reduce the possibility that the quartz plate 6 will peel from the package base 2. When peeling does not occur, the warpage of the solid-state imaging device itself can be reduced. The reason is that the package base has a larger coefficient of thermal expansion in the direction in which the metal plate projects, the quartz plate has a larger coefficient of thermal expansion in the direction perpendicular to the optical axis, and therefore disposing the package base and the quartz plate so that the metal plate projects in the direction perpendicular to the optical axis can relax the stress on the bonded parts of the package base and the quartz plate.

Because the amount of deformation of the package base 2 can be reduced, high-quality images can be obtained more stably.

Thus, this embodiment provides a solid-state imaging device that has higher heat resistance and can obtain high-quality images.

Third Embodiment

Figure 6:
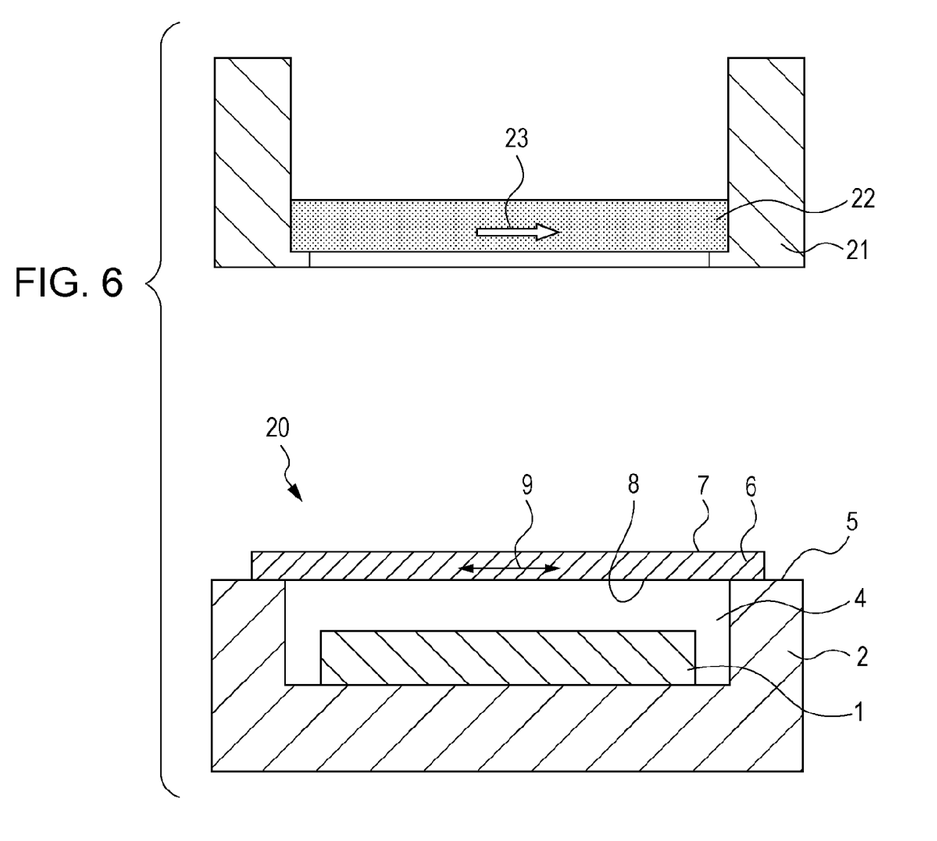
FIG. 6 illustrates an imaging unit of a third embodiment.

FIG. 6 is a sectional view showing an imaging unit as a third embodiment.

The solid-state imaging device 20 of FIG. 6 is the solid-state imaging device shown in FIG. 1. On the light entrance side, the front of the solid-state imaging device 20, is placed an optical low-pass filter 22 held by a holder 21. In other words, the optical low-pass filter (LPF) is disposed on the opposite side of the quartz plate of the solid-state imaging device from the imaging element and is disposed adjacent to the quartz plate. The direction of separation of light incident on the optical LPF 22 is the direction denoted by reference numeral 23. The term "separation" means that a ray of light is separated into an ordinary ray and an extraordinary ray.

The optical LPF 22 is placed so that the separation direction 23 corresponds to the optical axis direction 9 of the crystal of the quartz plate 6 of the solid-state imaging device 20. Such a configuration can prevent the decrease in resolution due to the solid-state imaging device.

The reason is that a ray of light perpendicularly incident on the optical LPF 22 does not undergo double refraction of light, that is, separation of light when passing through the quartz plate 6. Although a ray of light obliquely incident on the major surface of the optical LPF 22 undergoes separation of light when passing through the quartz plate 6, the separation direction corresponds to the separation direction of the optical LPF 22, and therefore the decrease in resolution can be limited to only one direction.

Figure 7:
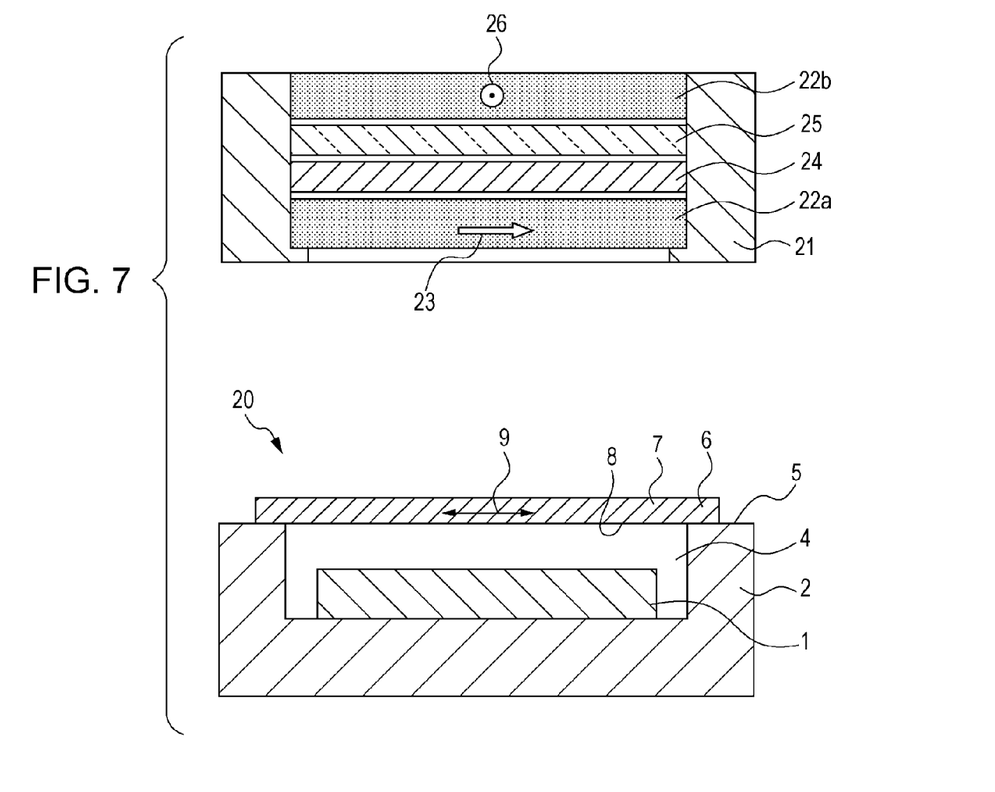
FIG. 7 illustrates a modification of the imaging unit of the third embodiment.

FIG. 7 shows an imaging unit showing another form of this embodiment.

The imaging unit of FIG. 7 differs from the imaging unit of FIG. 6 in that the imaging unit of FIG. 7 is a four-point separation type imaging unit having a plurality of optical LPFs. As shown in FIG. 7, the holder 21 of the imaging unit holds optical LPFs 22a and 22b, and a phase plate 24 and an IR cut glass plate 25 disposed between the optical LPFs 22a and 22b.

In such a configuration, the same benefits as those described above can be obtained by making the light separation direction 23 of the optical LPF 22a closest to the solid-state imaging device 20 parallel to the optical axis direction 9 of the crystal of the quartz plate 6. As shown, the separation direction 26 of the optical LPF 22b is perpendicular to the separation direction 23 of the optical LPF 22a.

The imaging unit shown in this embodiment is a unit incorporated in an imaging apparatus such as a camera or a video camera. The holder including an optical LPF or optical LPFs and the solid-state imaging device may be integrated or separate components as long as the optical LPF or optical LPFs and the quartz plate are arranged in the above-described relationship.

Fourth Embodiment

Figure 8A:
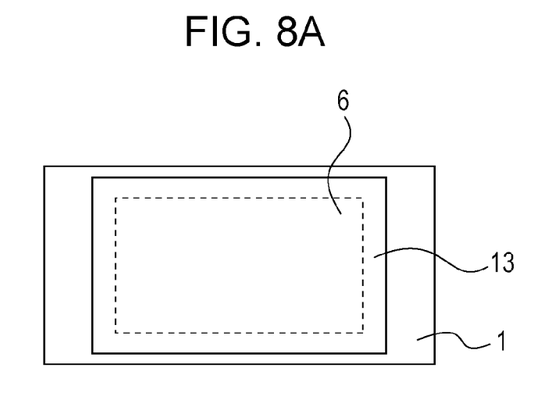
FIGS. 8A and 8B illustrate a solid-state imaging device of a fourth embodiment.
Figure 8B:
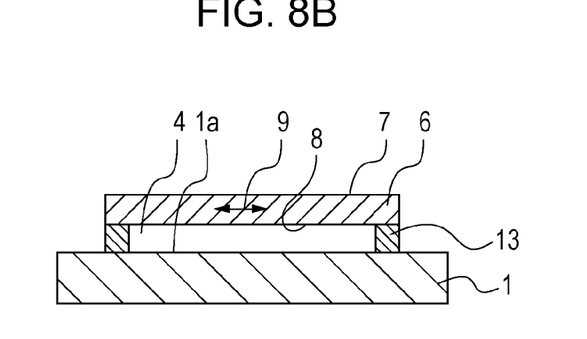

FIGS. 8A and 8B are a plan view and a sectional view, respectively, showing a solid-state imaging device as a fourth embodiment.

This solid-state imaging device differs from the above-described solid-state imaging devices in that a quartz plate as a cover member is fixed to a solid-state imaging element with a frame portion therebetween.

As shown in FIGS. 8A and 8B, the solid-state imaging element 1 and the quartz plate 6 are each fixed to the frame portion 13 with adhesive (not shown). As a result, the solid-state imaging device has a space 4 surrounded by the solid-state imaging element 1, the frame portion 13, and the quartz plate 6. The first major surface 7 and the second major surface 8 of the quartz plate 6 are disposed parallel to the light receiving surface 1a of the solid-state imaging element 1. The optical axis direction 9 of the crystal of the quartz plate 6 is disposed parallel to the light receiving surface 1a of the solid-state imaging element 1. Therefore, the first major surface 7 and the second major surface 8 of the quartz plate 6 are parallel to the optical axis direction 9 of the crystal of the quartz plate 6. The thickness of the quartz plate is at least 0.2 mm but no more than 1.0 mm, or at least 0.3 mm but no more than 0.6 mm.

The foregoing configuration can reduce the possibility that the cover member will break or peel and can reduce the possibility of the decrease in resolution. Therefore, a solid-state imaging device can be obtained that has high reliability and can obtain high-quality images.

Fifth Embodiment

Figure 9:
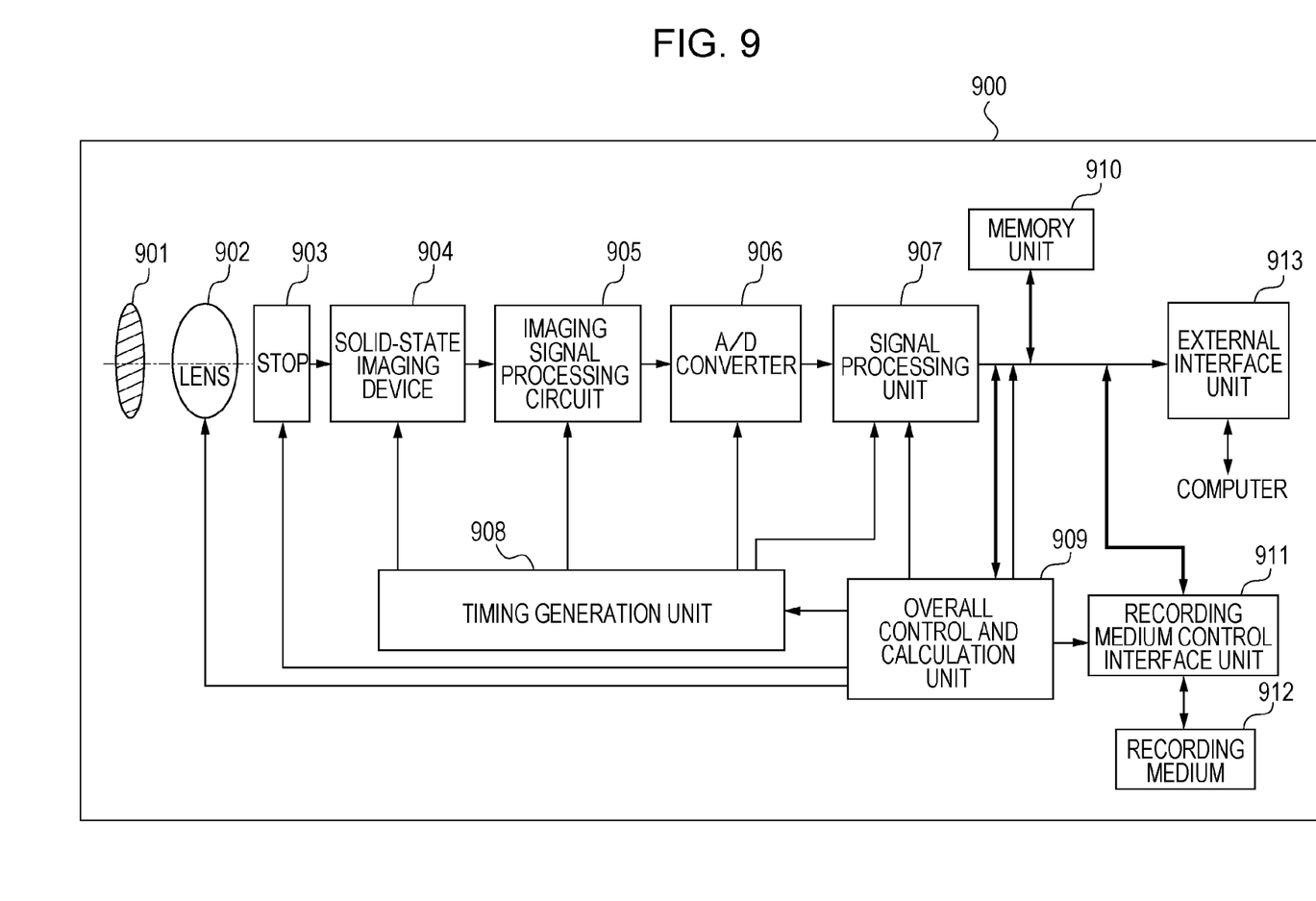
FIG. 9 illustrates an imaging apparatus using a solid-state imaging device of an embodiment.

FIG. 9 is a block diagram overview of an embodiment of the present invention. An imaging apparatus 900 has a solid-state imaging device 904 typified by the solid-state imaging devices of the first, second, and fourth embodiments. Instead of a solid-state imaging device 904, the imaging apparatus 900 may have the imaging unit of the third embodiment. The imaging apparatus is, for example, a camera or video camera that can shoot still or moving images.

The blocks 905 to 908 may be formed on the same chip as the solid-state imaging device 904. Each block of the imaging apparatus 900 is controlled by an overall control and calculation unit 909. In addition, the imaging apparatus 900 has a memory unit 910 for temporarily storing image data, and a recording medium control interface unit 911 for writing or reading images on or from a recording medium. The recording medium 912 includes, for example, a semiconductor memory and is removable. The imaging apparatus 900 may have an external interface unit 913 for communicating, for example, with an external computer.

Next, the operation of the imaging apparatus 900 shown in FIG. 9 will be described. In response to opening of a barrier 901, the main power, the power to the control system, and the power to the imaging circuit including the A/D converter 906, are turned on in sequence. After that, in order to control the exposure value, the overall control and calculation unit 909 fully opens the diaphragm 903. A signal output from the solid-state imaging device 904 passes through the imaging signal processing circuit 905 and is provided to the A/D converter 906. The A/D converter 906 A/D converts the signal and outputs the A/D converted signal to the signal processing unit 907. The signal processing unit 907 processes the data and provides the processed data to the overall control and calculation unit 909. The overall control and calculation unit 909 performs calculation for determining the exposure value. The overall control and calculation unit 909 controls the diaphragm 903 on the basis of the determined exposure value.

Next, the overall control and calculation unit 909 extracts a high frequency component from the signal output from the solid-state imaging device 904 and processed in the signal processing unit 907, and calculates the distance to the object on the basis of the high frequency component. After that, the overall control and calculation unit 909 drives the lens 902 and determines whether the object is in focus. If the overall control and calculation unit 909 determines that the object is out of focus, it drives the lens 902 again and calculates the distance.

After it is confirmed that the object is in focus, actual exposure is started. After exposure is completed, an imaging signal output from the solid-state imaging device 904 is corrected in the imaging signal processing circuit 905, A/D converted in the A/D converter 906, and processed in the signal processing unit 907. The image data processed in the signal processing unit 907 is stored in the memory unit 910 by the overall control and calculation unit 909.

After that, the image data stored in the memory unit 910 is recorded on the recording medium 912 through the recording medium control interface unit 911 under the control of the overall control and calculation unit 909. The image data can be provided through the external interface unit 913 to a computer or the like and processed by it.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-040599 filed Feb. 25, 2010, which is hereby incorporated by reference herein in its entirety.

What is claimed is:

1. A solid-state imaging device comprising:
a package base having a frame portion and a recessed portion;
an imaging element having a light receiving surface, the imaging element being fixed to the recessed portion; and
a cover member disposed over the imaging element, wherein the cover member has a quartz plate directly fixed to the frame portion with an adhesive,
wherein an inclination of an optical axis of a crystal of the quartz plate to the light receiving surface is within a range of ±3°, and
wherein the quartz plate is the only quartz plate that the cover member has.

2. The solid-state imaging device according to claim 1, wherein an effective pixel region of the light receiving surface is rectangular, the effective pixel region has a long side and a short side shorter than the long side, and the short side of the effective pixel region is arranged along the optical axis of the crystal of the quartz plate.

3. The solid-state imaging device according to claim 1, wherein a surface of the quartz plate opposite to the light receiving surface is rectangular, the surface of the quartz plate has a long side and a short side shorter than the long side, and the short side of the surface is arranged along the optical axis of the crystal of the quartz plate.

4. The solid-state imaging device according to claim 1, wherein an electrical axis of the crystal or a mechanical axis of the crystal is parallel to the light receiving surface.

5. The solid-state imaging device according to claim 1, wherein the quartz plate and the cover member have a thickness of at least 0.3 mm but no more than 0.6 mm.

6. The solid-state imaging device according to claim 1, wherein the package base has a resin body and a metal plate integrated with the resin body.

7. The solid-state imaging device according to claim 1, wherein the package base has a metal part projecting from a side of the package base, in a direction perpendicular to the optical axis of the crystal of the quartz plate.

8. The solid-state imaging device according to claim 7, wherein the metal part is made of stainless steel or aluminum.

9. The solid-state imaging device according to claim 1, wherein the quartz plate and the imaging element face one space surrounded by the package base and the cover member in common.

10. The solid-state imaging device according to claim 1, wherein the package base and the quartz plate differ in coefficient of thermal expansion.

11. The solid-state imaging device according to claim 1, wherein the cover member has an AR coating or an IR cut coating on the quartz plate.

12. An imaging unit comprising:
a package base having a frame portion and a recessed portion;
an imaging element having a light receiving surface, the imaging element being fixed to the recessed portion;
a cover member disposed over the imaging element and directly fixed to the frame portion with an adhesive;
an optical low-pass filter disposed on an opposite side of the cover member from the imaging element; and
a holder other than the package base,
wherein the holder holds the optical low-pass filter,
wherein the cover member has a quartz plate, and
wherein an inclination of an optical axis of a crystal of the quartz plate to the light receiving surface is within a range of ±3°.

13. An imaging unit comprising:
an imaging element having a light receiving surface;
a cover member disposed over the imaging element with a space between the cover member and the imaging element, wherein the cover member has a quartz plate, and an inclination of an optical axis of a crystal of the quartz plate to the light receiving surface is within a range of ±3°; and
an optical low-pass filter disposed on an opposite side of the quartz plate from the imaging element,
wherein the optical low-pass filter separates a ray of light in a direction along the optical axis of the crystal of the quartz plate.

14. An imaging unit comprising:
an imaging element having a light receiving surface;
a cover member disposed over the imaging element with a space between the cover member and the imaging element, wherein the cover member has a quartz plate, and an inclination of an optical axis of a crystal of the quartz plate to the light receiving surface is within a range of ±3°;

a first optical low-pass filter disposed on an opposite side of the quartz plate from the imaging element, the first low-pass filter separating a ray of light in a first direction; and a second optical low-pass filter disposed on an opposite side of the first optical low-pass filter from the quartz plate, the second low-pass filter separating a ray of light in a second direction other than the first direction.

15. The imaging unit according to claim 14, wherein the first low-pass filter separates the ray of light in a direction along the optical axis of the crystal of the quartz plate.

16. The imaging unit according to claim 14, further comprising a phase plate disposed between the first optical low-pass filter and the second optical low-pass filter.

17. An imaging apparatus comprising:
the solid-state imaging device according to claim 1; and
a signal processing unit that processes a signal obtained by the solid-state imaging device.

18. A solid-state imaging device comprising:
an imaging element having a light receiving surface; and
a cover member having a first major surface and a second major surface and having a thickness of at least 0.2 mm but no more than 1.0 mm,
the cover member being disposed over imaging element so that light to be received on the light receiving surface passes through the cover member from the first major surface to the second major surface and through a space between the second major surface and the light receiving surface,
wherein the cover member has a quartz plate, an inclination of an optical axis of a crystal of the quartz plate to the first major surface and the second major surface is within a range of ±3°,
wherein the first major surface is formed by an AR coating or an IR cut coating,
wherein the second major surface is formed by the quartz plate or a thin film coating directly on the quartz plate, and
wherein there is no plate between the second major surface and the light receiving surface.

19. The solid-state imaging device according to claim 18, wherein the second major surface is rectangular, the second major surface has a long side and a short side shorter than the long side, and the short side of the second major surface is arranged along the optical axis of the crystal of the quartz plate.

20. The solid-state imaging device according to claim 18, wherein an electrical axis of the crystal or a mechanical axis of the crystal is parallel to the first major surface and the second major surface.

21. The solid-state imaging device according to claim 18, further comprising a frame that surrounds the space.

22. The solid-state imaging device according to claim 18, wherein the cover member is fixed to a frame portion that surrounds the space.

23. The solid-state imaging device according to claim 18, wherein the quartz plate is the only quartz plate that the cover member has.

24. An imaging unit comprising:
the solid-state imaging device according to claim 18; and
an optical low-pass filter disposed on an opposite side of the quartz plate from the imaging element,
wherein the low-pass filter separates a ray of light in a direction along the optical axis of the crystal of the quartz plate.

25. An imaging unit comprising:
the solid-state imaging device according to claim 1;
an optical low-pass filter disposed on a light entrance side of the cover member; and
a holder other than the package base, wherein the holder holds the optical low-pass filter.

26. A solid-state imaging device comprising:
an imaging element having a light receiving surface; and
a cover member disposed over the imaging element with a space between the cover member and the imaging element,
wherein the cover member has a quartz plate, and an inclination of an optical axis of a crystal of the quartz plate to the light receiving surface is within a range of ±3°, and
wherein an effective pixel region of the light receiving surface is rectangular, the effective pixel region has a long side and a short side shorter than the long side, and the short side of the effective pixel region is arranged along the optical axis of the crystal of the quartz plate.

27. The solid-state imaging device according to claim 26, wherein the cover member has a thickness of at least 0.2 mm but no more than 1.0 mm, and has an AR coating or an IR cut coating.

28. The solid-state imaging device according to claim 26, wherein the quartz plate is the only quartz plate that the cover member has.

29. An imaging apparatus comprising:
the solid-state imaging device according to claim 26; and
a signal processing unit that processes a signal obtained by the solid-state imaging device.

30. An imaging apparatus comprising:
the solid-state imaging device according to claim 18; and
a signal processing unit that processes a signal obtained by the solid-state imaging device.

* * * * *